US006774692B2

(12) United States Patent
Kim et al.

(10) Patent No.: US 6,774,692 B2
(45) Date of Patent: Aug. 10, 2004

(54) APPARATUS AND METHOD FOR PROVIDING SQUARE WAVE TO ATOMIC FORCE MICROSCOPE

(75) Inventors: Young-hwan Kim, Busan (KR); Chung Choo Chung, Seoul (KR); Haiwon Lee, Seongnam (KR)

(73) Assignee: Hanyang Hak Won Co., Ltd., Seoul (KR)

( * ) Notice: Subject to any disclaimer, the term of this patent is extended or adjusted under 35 U.S.C. 154(b) by 0 days.

(21) Appl. No.: 10/124,023

(22) Filed: Apr. 17, 2002

(65) Prior Publication Data

US 2003/0001641 A1 Jan. 2, 2003

(30) Foreign Application Priority Data

Jun. 28, 2001 (KR) ........................................ 2001-37879
Jul. 20, 2001 (KR) ........................................ 2001-43926
Jan. 30, 2002 (KR) .......................................... 2002-5360
Jan. 30, 2002 (KR) .......................................... 2002-5361

(51) Int. Cl.[7] .......................... H03K 3/017; H03K 5/04
(52) U.S. Cl. ........................ 327/172; 327/174; 327/176
(58) Field of Search ................................ 327/164, 165, 327/172–174, 176, 178, 179, 180, 184, 303, 291, 299

(56) References Cited

U.S. PATENT DOCUMENTS 3,678,399 A * 7/1972 Mottier et al. ................ 327/42
4,042,834 A * 8/1977 Pace .......................... 327/116
4,563,741 A * 1/1986 Matsumura ................. 701/115
RE33,301 E * 8/1990 Oshikiri et al. ............... 327/41
5,157,277 A * 10/1992 Tran et al. .................. 327/156
6,483,362 B2 * 11/2002 Otani et al. ................. 327/172

FOREIGN PATENT DOCUMENTS

JP 62-100015 * 5/1987

OTHER PUBLICATIONS

Howland, Rebecca and Benatar, Lisa; "Guide To Scanning Probe Microscopy", Park Scientific Instruments (Sunnyvale, CA: 1993–1997), pp. 1–73.

* cited by examiner

*Primary Examiner*—Tuan T. Lam
(74) *Attorney, Agent, or Firm*—St. Onge Steward Johnston & Reens LLC

(57) ABSTRACT

An apparatus and method for providing an input signal having a desired pulse width and amplitude to atomic force miscoscopes (AFMs) for use in nano-lithography are provided. An input signal providing apparatus for a contact type AFM includes: a pulse width adjusting unit which adjusts the width of a positive pulse of an input square wave to a predetermined pulse width; and an amplitude adjusting unit which adjusts the amplitude of the positive pulse of the square wave to a predetermined voltage. An input signal providing method for the contact type AFM uses the apparatus having this structure. An input signal providing apparatus for a non-contact type AFM further includes a square pulse generating unit which generates a square pulse having a predetermined phase in synchronization with an input resonance signal, and an input signal providing method for the non-contact type AFM further involves generating the square pulse having a predetermined phase in synchronization with the input resonance signal. As a result, more precise nano-lithography can be achieved using an AFM to which the apparatus and method described above are applied.

16 Claims, 19 Drawing Sheets

804
VCC
14
7
1905
1906
1904
1
2
3
4
5
6
OUTPUT
A
803
S1
802
D1
Zenor
R1
801
1901
-Vcc
Vcc
R2
R3
SQUARE PULSE PHASE DETERMINATION SIGNAL
RESONANCE SIGNAL

APPARATUS AND METHOD FOR PROVIDING SQUARE WAVE TO ATOMIC FORCE MICROSCOPE

BACKGROUND OF THE INVENTION

1. Field of the Invention

The present invention relates to an apparatus and method for providing an input signal having a desired pulse width and amplitude to an atomic force microscope used in nano-lithography.

2. Description of the Related Art

In general, atomic force microscopes (AFMs) are used to image the surface of a sample without causing damage to the sample. AFMs are also used in nano-lithography applications to control the arrangement of atoms or molecules on a sample surface by applying a force to damage the sample surface using a probe.

In constructing an artificial nano-sized structure by adjusting physical quantities, such as electron density or energy level, on a nanometer scale, a conventional technique such as e-beam lithography cannot be controlled on a scale less than 10 nm. AFM-based lithography is the unique technique applicable to adjust physical quantities on the scale of a few nanometers.

AFM-based nano-lithography is applied in a variety of ways, for example, to form a micro-miniature pattern using a resist material or to form an oxide pattern by applying an electric field to the surface of a hydrogen passivation silicon or polysilicon wafer with an AFM tip.

In addition, an effort to apply AFM-based nano-lithography to a next-generation data storage technique in conjunction with electrostatic force microscopy or scanning capacitance microscopy is being made (*SPM—Scanning Probe Microscopy by Sang-il Part, Jae-won Hong, and Young-gil Nho in PAIA*, p. 12).

Such AFM-based nano-lithography techniques are classified into contact type AFM-based and non-contact type AFM-based techniques.

In imaging the surface of a sample using a non-contact type AFM, the magnitude of atomic attraction is as small as on the order of 0.1–0.01 nN so that the angle at which a cantilever is bent cannot be directly measured, and thus the cantilever mechanically vibrates at a resonance frequency.

As the cantilever approaches the surface of a sample, the resonance frequency changes due to atomic attraction, and changes in amplitude and phase are measured using a lock-in amplifier (*SPM—Scanning Probe Microscopy by San-il Part, Jae-won Hong, and Young-gil Nho in PSIA*, p. 7–8).

This principle is inversely applied in nano-lithography. In particular, when a voltage is applied to the tip of the cantilever for a predetermined period of time, an oxide pattern can be formed by the electric field generated at the tip of the cantilever.

In a conventional method, a DC voltage of −12–12V is applied to induce an electric field. Actually, to form a 1-nm-thick oxide layer, the duration is long enough to apply a voltage for a few microseconds. Therefore, it is unnecessary to apply a continuous bias voltage such as the DC voltage. Rather, a problem of reliability occurs with the application of a continuous bias voltage, due to interaction between the tip and the surface of the sample.

To address this problem, there is a need for a technique to instantaneously apply a voltage only for lithography, but there hasn't been enough research on this technique.

In using a contact-type AFM, a predetermined oxide pattern is formed by applying a voltage in a square wave form to the tip for a predetermined period of time, unlike when using a non-contact type AFM. A duration of a few microseconds is enough to apply a square wave to the contact type AFM. However, since the square wave has a pulse width of about 1 ms, substantially the same effects are provided as when a DC voltage is applied. Therefore, it is difficult to precisely apply nano-lithography with such a square wave applied to the conventional AFM.

SUMMARY OF THE INVENTION

To solve the above-described problems, it is a first object of the present invention to provide an apparatus for providing an input signal at a desired point of time as a square wave having a desired pulse width and amplitude to an atomic force microscope (AFM).

It is a second object of the present invention to provide a method for providing an input signal at a desired point of time as a square wave having a desired pulse width and amplitude to an AFM.

It is a third object of the present invention to provide a computer readable medium having embodied thereon a computer program for the input signal providing method.

To achieve the first object of the present invention, there is provided an apparatus for providing an input signal having a desired pulse width and amplitude to a contact type AFM for use in nano-lithography, the apparatus comprising: a pulse width adjusting unit which adjusts the width of a positive pulse of an input square wave to a predetermined pulse width; and an amplitude adjusting unit which adjusts the amplitude of the positive pulse of the square wave to a predetermined voltage.

To achieve the second object of the present invention, there is provided a method for providing an input signal having a desired pulse width and amplitude to a contact type AFM for use in nano-lithography, the method comprising: adjusting the width of a positive pulse of an input square wave to a predetermined pulse width; and adjusting the amplitude of the positive pulse of the square wave to a predetermined voltage.

The first object of the present invention is also achieved by an apparatus for providing an input signal to a non-contact type AFM for use in nano-lithography with a resonance signal, the apparatus comprising: a square pulse generating unit which generates a square pulse having a predetermined phase in synchronization with the resonance signal, and a pulse width adjusting unit which adjusts the width of a positive pulse of the square pulse to a predetermined pulse width.

The first object of the present invention is also achieved by an apparatus for providing an input signal to a non-contact type AFM for use in nano-lithography with a resonance signal, the apparatus comprising: a square pulse phase determination signal generator which generates a square pulse phase determination signal as a predetermined DC voltage according to a desired square pulse trigger point; and a first square pulse generator which generates a positive pulse of a square wave at a point of time at which the voltage of the resonance signal rises above the square pulse phase determination signal.

The second object of the present invention is also achieved by a method for providing an input signal having a desired pulse width and amplitude to a non-contact type AFM for use in nano-lithography with a resonance signal, the method comprising: generating a square pulse having a predetermined phase in synchronization with the resonance signal; and adjusting the width of a positive pulse of a square wave to a predetermined pulse width.

The third object of the present invention is achieved by computer readable media having embodied thereon computer programs for the methods for providing an input signal to a contact type and non-contact type AFM.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
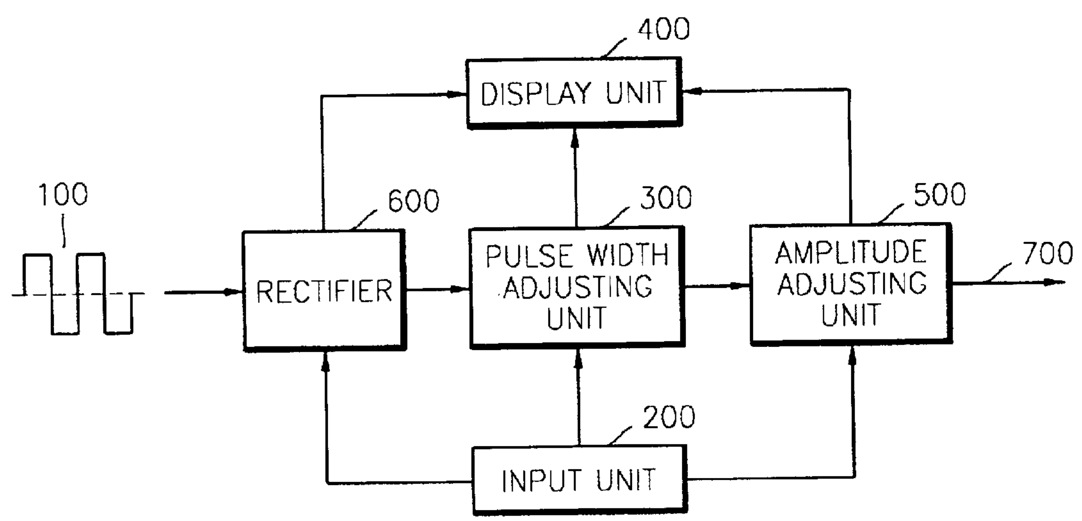
FIG. 1 is a block diagram of an apparatus for providing an input signal to a contact type atomic force microscope (AFM) according to the present invention.
Figure 2A:
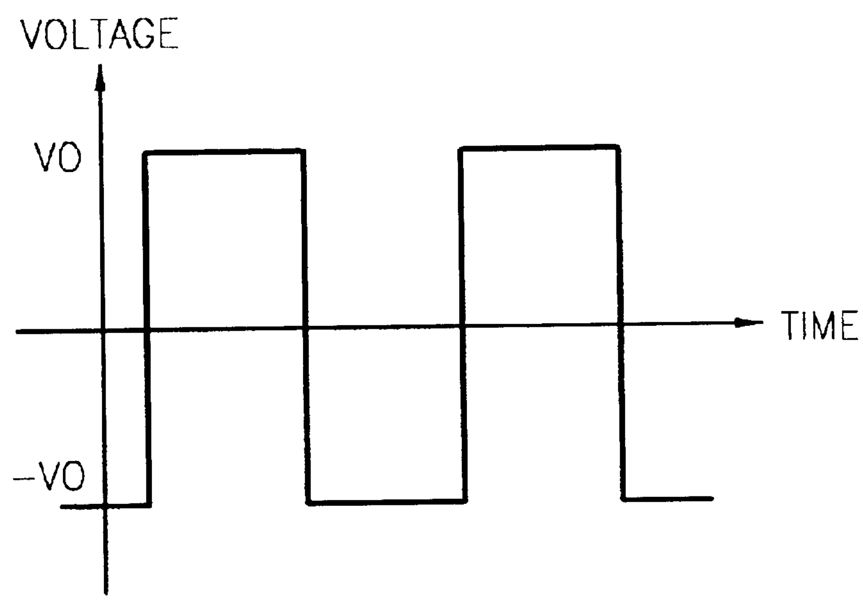
FIGS. 2A and 2B show an input signal input to the apparatus of FIG. 1 and an output signal of a rectifier of FIG. 1, respectively.
Figure 2B:
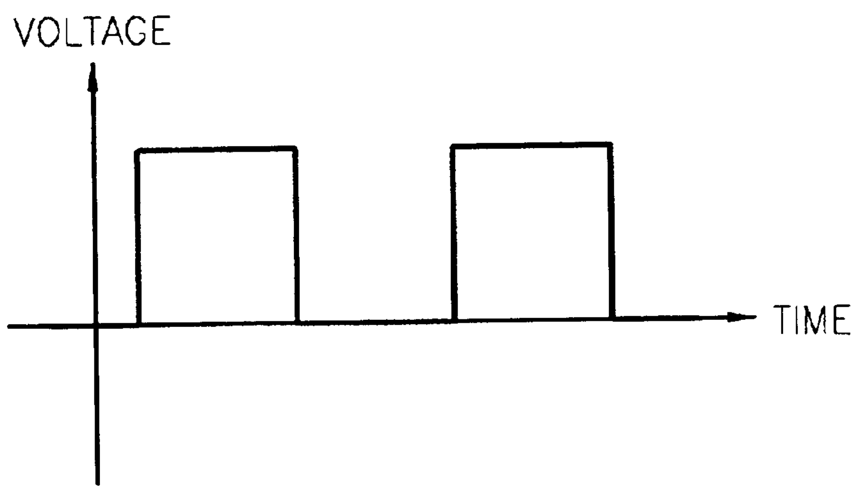

An apparatus for providing an input signal to a contact type atomic force microscope (AFM) according to the present invention is shown in FIG. 1. Referring to FIG. 1, the apparatus receives a square wave 100 of −10–10V, as shown in FIG. 2A. The square wave 100 is changed to a square wave having only positive voltage component, as shown in FIG. 2B, by a rectifier 600. It is preferable that the rectifier 600 is implemented with a Zener diode.

The square wave passes through a pulse width adjusting unit 300 and an amplitude adjusting unit 500 so that the phase, width (duration), and amplitude of the square wave are changed according to a user's instruction. In particular, the pulse width adjusting unit 300 adjusts the width of a positive pulse of the square wave to a predetermined value input by a user via an input unit 200. The amplitude adjusting unit 500 amplifies the amplitude of the positive pulse of the square wave output from the amplitude adjusting unit 300 to a predetermined voltage input by the user via the input unit 200. The resulting square pulse train having the phase, width, and amplitude adjusted according to the user's instruction is input to a contact type AFM 700.

Information on the square pulse train generated by the elements described above is displayed on a display unit 400 to allow the user to confirm the information on the square wave.

Figure 3:
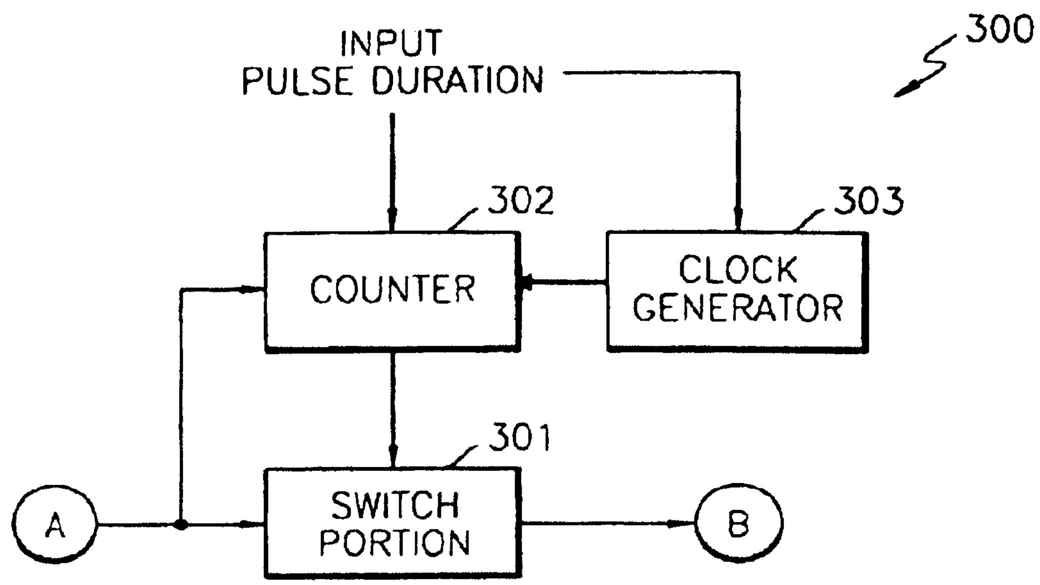
FIG. 3 is a block diagram showing the structure of a pulse width adjusting unit of FIG. 1.

After rectification, the width of the positive pulse of the square wave is adjusted by the pulse width adjusting unit 300. FIG. 3 is a block diagram showing the structure of the pulse width adjusting unit 300.

As the user inputs a predetermined pulse width via the input unit 200, the predetermined pulse width is input to a counter 302 and a clock generator 303. It is preferable that the user inputs a pulse width by dividing the pulse width into two parts. a time unit and multiplication factor which produce the pulse width when multiplied together. For example, a square pulse of width of 0.3 $\mu$sec is desired, a time unit of 0.1 $\mu$sec and a multiplication factor of 3 are input.

The time unit is input to the clock generator 303 and determines the rate of clock signals output from the clock generator 303. If the time unit is 0.1, a 10-MHz clock signal is generated. The counter 302 is triggered by a positive square pulse, counts clock signals from a point of time at which the positive square pulse is input, and generates a termination signal when the number of clock signals equals the multiplication factor of the pulse width. In the present embodiment, the termination signal is generated after three occurrences of clock signals following the input of the square pulse.

Upon receipt of the termination signal from the counter 302, a switch portion 301 changes the voltage of the input square pulse to 0V and outputs the changed voltage. The switch portion 301 can operate in a variety of manners.

The switch portion 301 adjusts the width of the positive square pulse by starting generation of the square pulse in response to the beginning of the positive square pulse and stopping the generation of the positive square pulse in response to the termination signal from the counter 302. The switch portion 301 may include a switch to externally transmit the square wave. In this case, the switch is opened upon receipt of the termination signal from the counter 302 so as not to output the positive pulse of the square wave to thereby adjust the width of the positive square pulse. Alternatively, the switch portion 301 may generate a positive pulse of the square wave upon receipt of a start signal from the counter 302 and stops the generation of the positive pulse of the square wave upon receipt of a termination signal from the counter 302, thereby adjusting the width of the square pulse. The switch portion 301 externally outputs the square wave only when a lithography enable signal is input.

Figure 4:
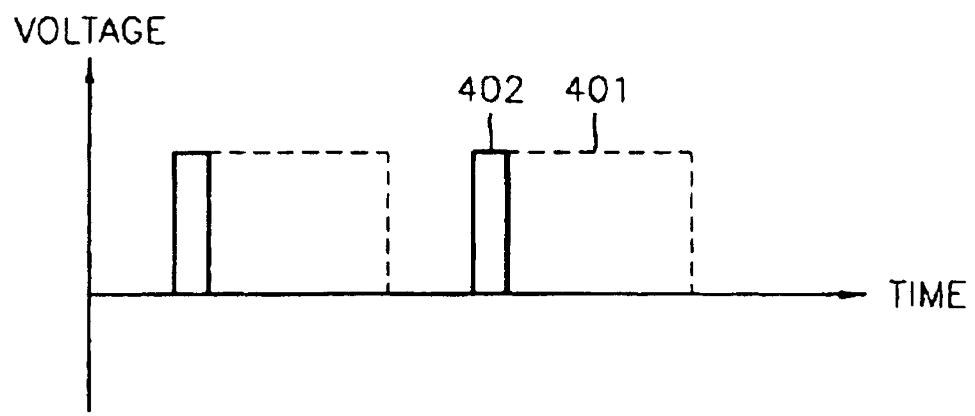
FIG. 4 illustrates an output square pulse train of the pulse width adjusting unit of FIG. 1.

FIG. 4 illustrates an output square pulse train of the pulse width adjusting unit 300. In FIG. 4, reference numeral 401 denotes a square pulse input to the pulse width adjusting unit 300, and reference numeral 402 denotes a square pulse output from the pulse width adjusting unit 300.

Figure 14:
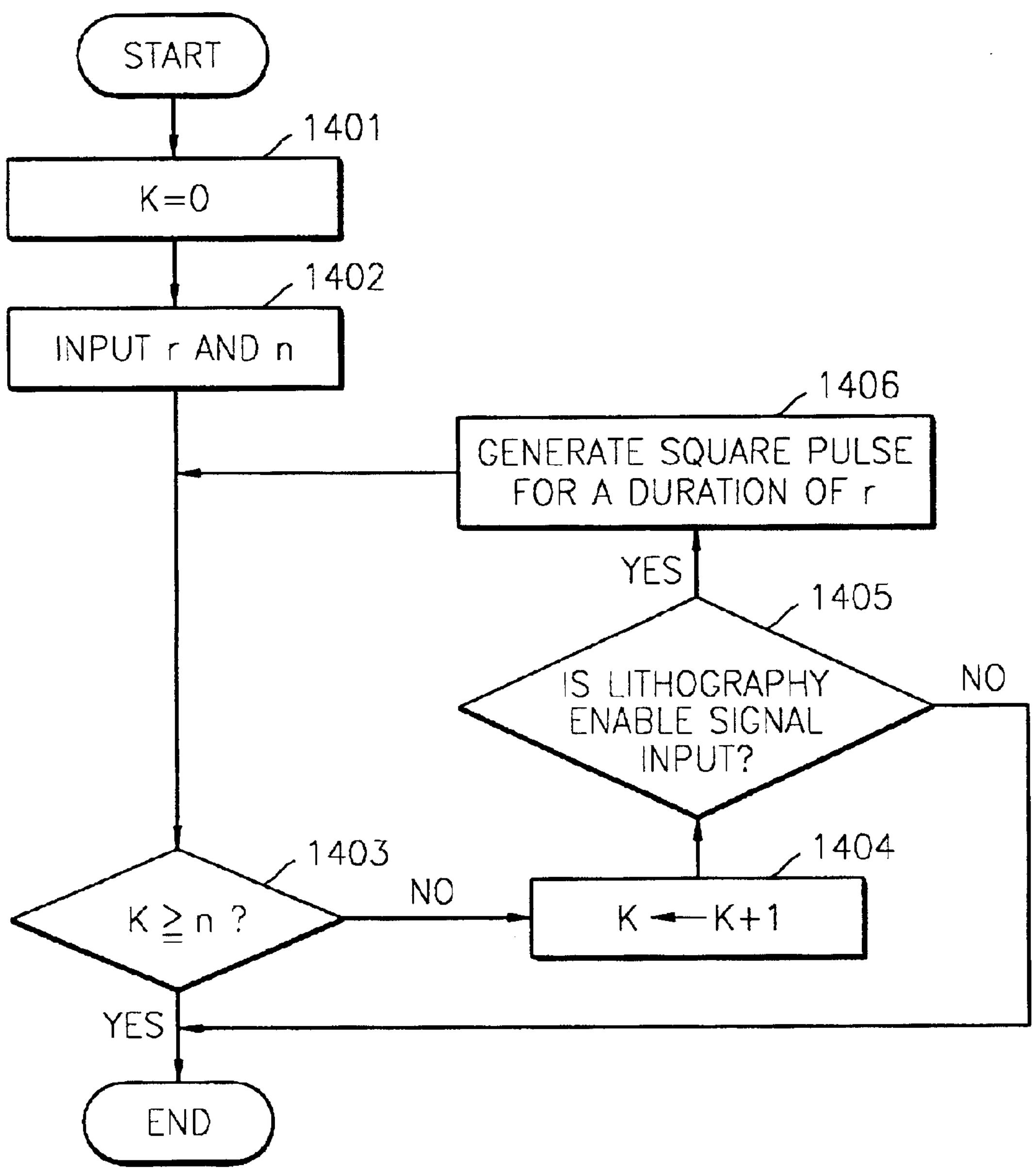
FIG. 14 is a flowchart illustrating an example of the operation performed by a pulse width adjusting unit.

FIG. 14 is a flowchart illustrating an example of the operation performed by the pulse width adjusting unit 300. Referring to FIG. 14, a count parameter k for the counter 302 is set to 0 (Step 1401). A user inputs a time unit r and a multiplication factor n, which produce a desired pulse width when multiplied together, through the input unit 200 (Step 1402).

The counter 302 increments the count parameter k for each clock (Step 1404). In Step 1406 , the pulse width adjusting unit 300 outputs a square pulse for only the time unit r when it is determined in Step 1405 that a lithography enable signal is input. These steps are repeated to continue the generation of the square pulse until the count parameter k equals the multiplication factor n input by the user.

The square pulse output from the pulse width adjusting unit 500 is input to the amplitude adjusting unit 500 for amplitude adjustment. The adjustment of the amplitude of the square pulse can be performed in many ways, for example, using an operating amplifier, metal oxide semiconductor field effect transistor (MOSFET), etc.

Figure 5:
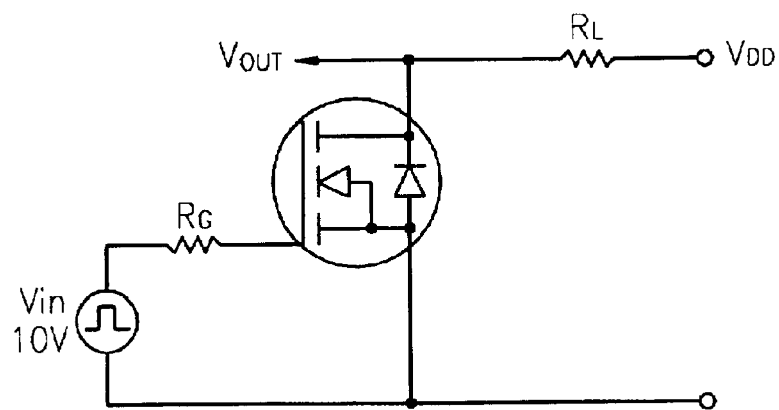
FIG. 5 is a general circuit diagram of an N-channel power metal oxide semiconductor field effect transistor (MOSFET)
Figure 6:
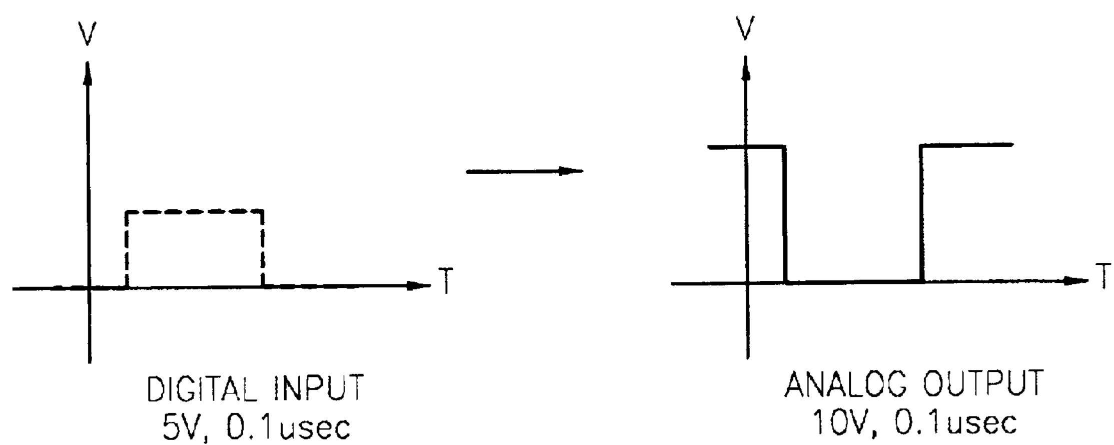
FIG. 6 illustrates an inversion of a square pulse to be input to the N-channel power MOSFET of FIG. 5.

FIG. 5 is a general circuit diagram of an N-channel power MOSFET. Since the MOSFET inverts and amplifies an input signal, the square pulse is inverted and then input in the present embodiment according to the present invention. FIG. 6 illustrates an inversion of a square pulse. In the present invention, the square pulse is inverted to a 10V-positive pulse and input to the MOSFET. When the inverted signal shown in FIG. 6 is used as a switching input signal of the MOSFET, the MOSFET is turned on for a period of time during which the input signal is zero, with the application of a voltage applied across the drain and. source of the MOSFET. As a result, the output waveform shown in FIG. 7 can be attained.

Figure 7:
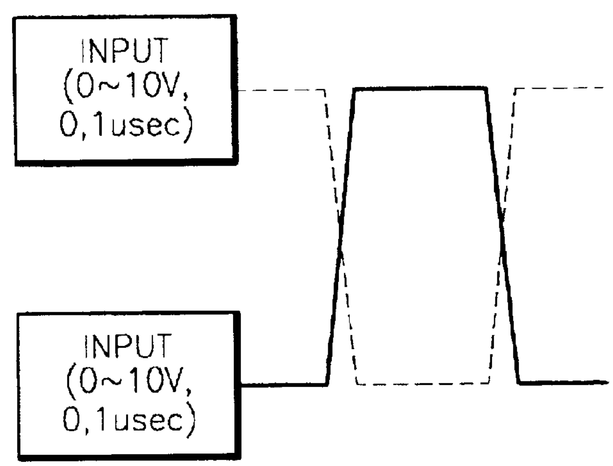
FIG. 7 shows input and output waveforms of the N-channel power MOSFET.

The output voltage of the MOSFET is determined by $V_{DD}$, and $V_{DD}$ is a value input via the input unit 200 by a user. FIG. 7 shows input and output waveforms of the MOSFET.

Figure 8:
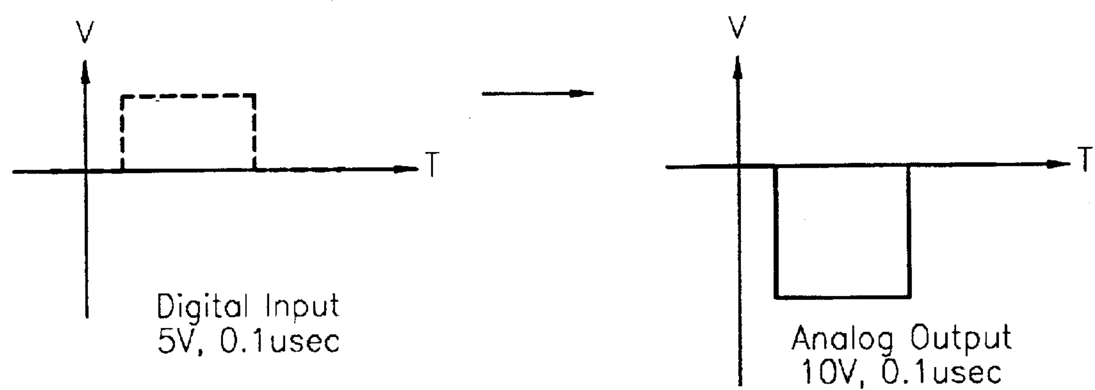
FIG. 8 shows an inverted input signal for an operating amplifier.
Figure 9A:
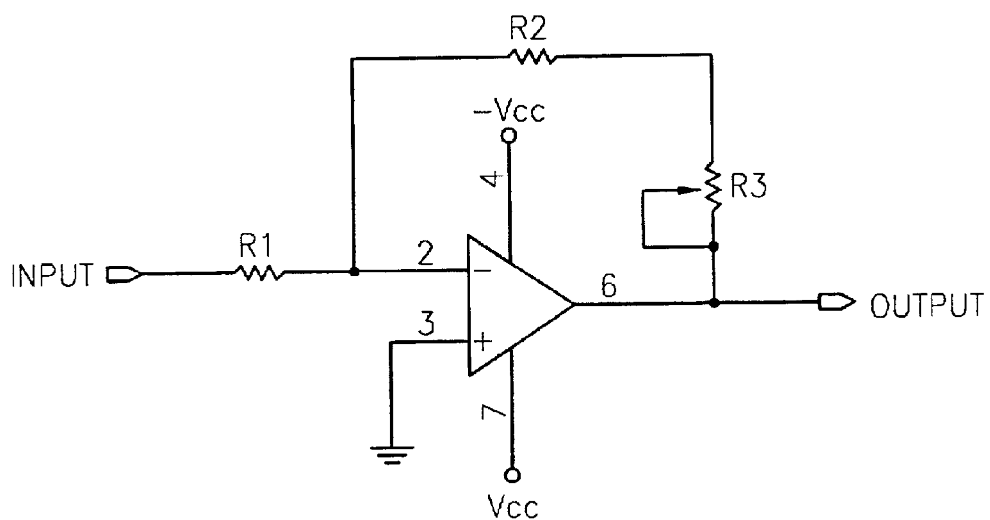
FIG. 9A is a circuit diagram of an example of an operating amplifier used in an embodiment of the present invention.
Figure 9B:
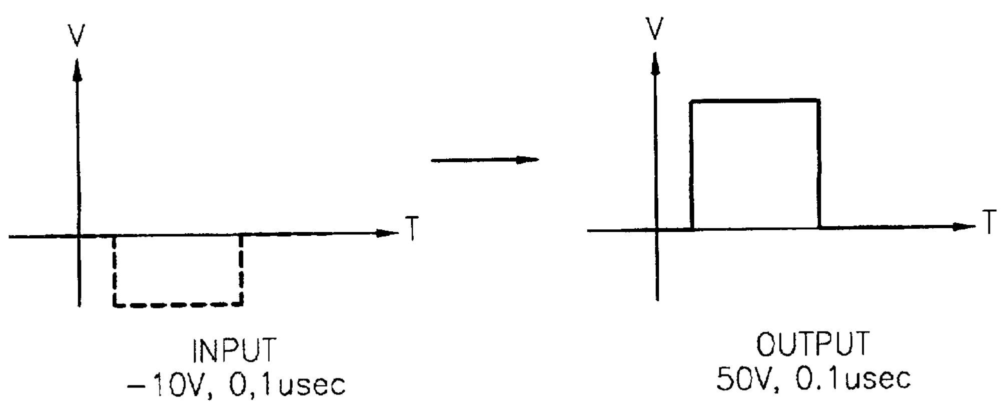
FIG. 9B shows the waveforms of the inverted input signal and the output signal of the operating amplifier of FIG. 9A.

As described above, the amplitude of the square pulse can be adjusted using an operating amplifier. FIG. 9A is a circuit diagram of an example of an operating amplifier used in an embodiment of the present invention. In FIG. 9A, an input signal is received through an inverted port 2, and inverted and amplified to output a positive square pulse. Here, the input signal is inverted, as shown in FIG. 8. FIG. 9B shows the waveforms of the inverted input signal and the output signal.

The voltage of the output square pulse is determined by the gain of the operating amplifier, which is varied by a variable resistor R3. A user inputs a desired output voltage value to the input unit 200 to adjust the variable resistance, and thus attain a desired output voltage of the square pulse. The voltage of the output square pulse is determined by the operating amplifier of FIG. 9A using formula (1) below:

$$V_{OUT} = -\frac{R_2 + R_3}{R_1} V_{IN} \tag{1}$$

Figure 10A:
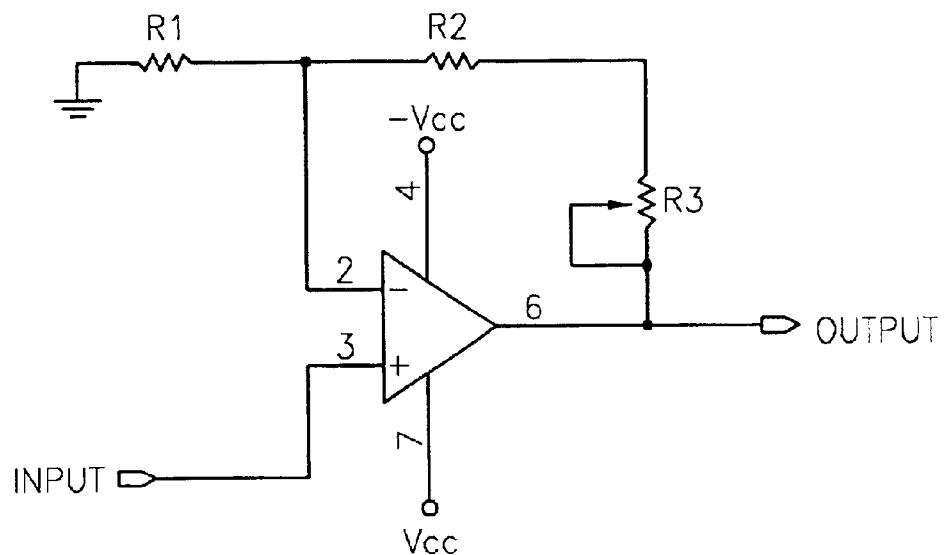
FIG. 10A is a circuit diagram of an operating amplifier having a non-inverted port for receiving an input signal.
Figure 10B:
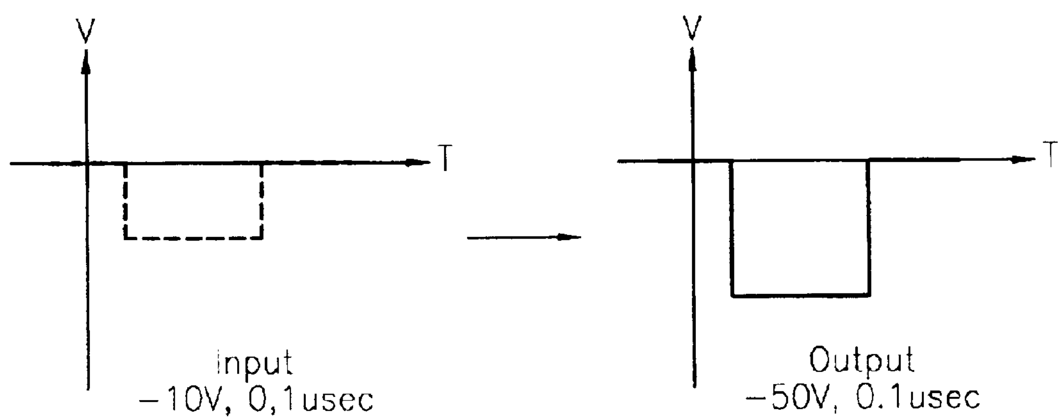
FIG. 10B shows the waveforms of input and output signals of the operating amplifier of FIG. 10A.

To attain a highly negative voltage, the inverted signal shown in FIG. 8 needs to be input through a non-inverted port 3. FIG. 10A is a circuit diagram of an operating amplifier having a non-inverted port 3 for receiving an input signal. FIG. 10B shows the waveforms of input and output signals of the operating amplifier of FIG. 10A.

Like the operating amplifier of FIG. 9A, the voltage of the output signal of the operating amplifier of FIG. 10A is determined by a variable resistor R3 according to the voltage input by the user. The voltage of the output square pulse is determined by the operating amplifier of FIG. 10A using formula (2) below:

$$V_{OUT} = \left(1 + \frac{R_2 + R_3}{R_1}\right) V_{IN} \tag{2}$$

Figure 11A:
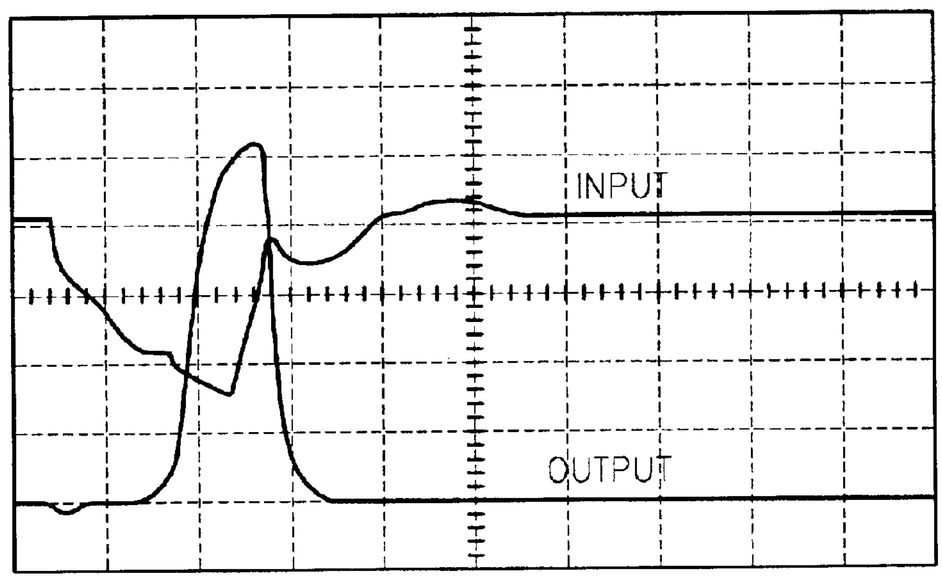
FIGS. 11A through 12B show the results of amplitude adjustments performed in embodiments of the present invention.
Figure 11B:
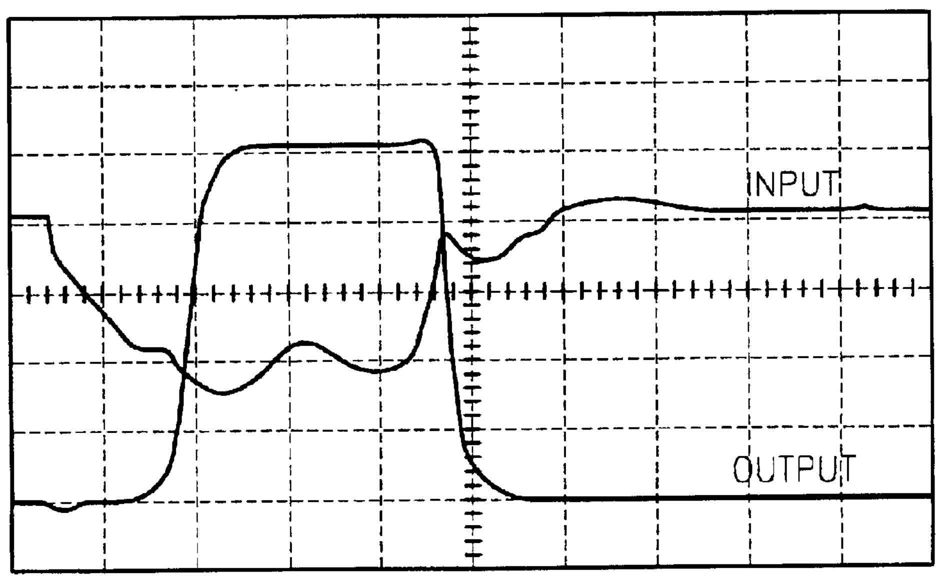

FIGS. 11A through 12B illustrate the results of amplitude adjustments performed in the embodiments according to the present invention. FIGS. 11A and 11B shows the results of amplitude adjustments using the MOSFET. FIG. 11A shows the generation of a 50-V output signal with an input signal having a pulse width of 0.1 μsec. FIG. 11B shows the generation of a 50-V output signal generated with an input signal having a pulse width of 0.3 μsec.

Figure 12A:
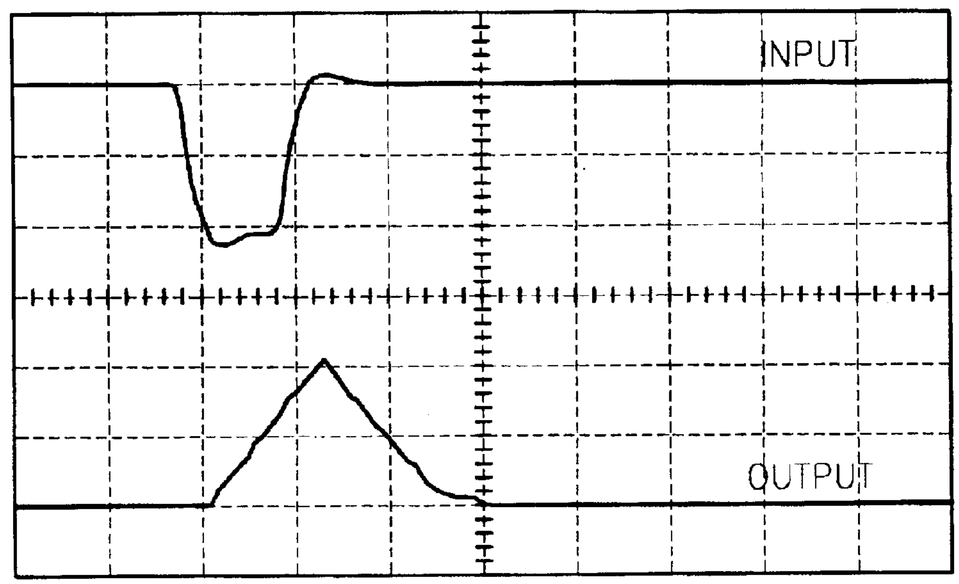
Figure 12B:
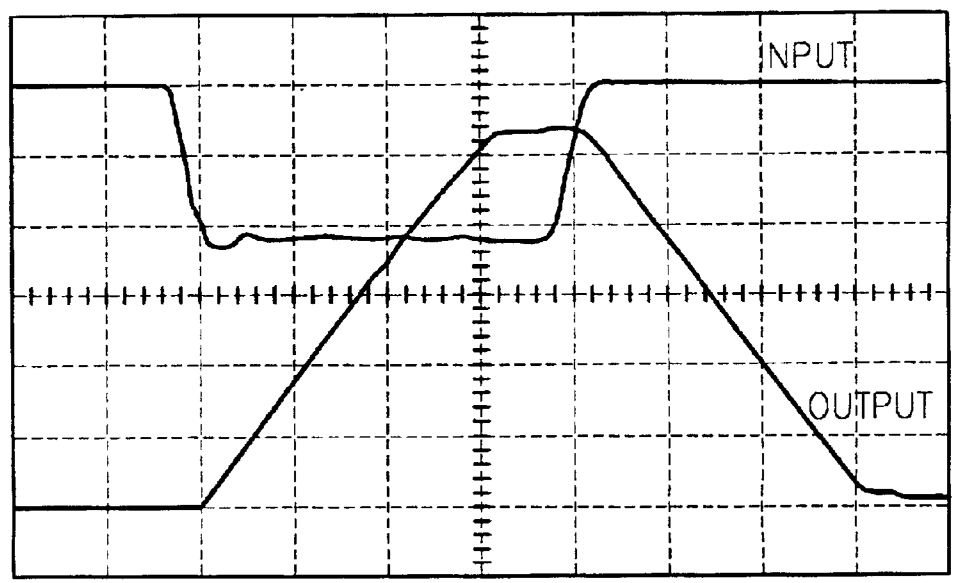

FIGS. 12A and 12B illustrate the results of amplification adjustments using the operating amplifier. FIG. 12A shows the generation of a 50-V output signal with an input signal having a pulse width of 0.1 μsec. FIG. 12B shows the generation of a 50-V output signal generated with an input signal having a pulse width of 0.3 μsec.

Figure 13:
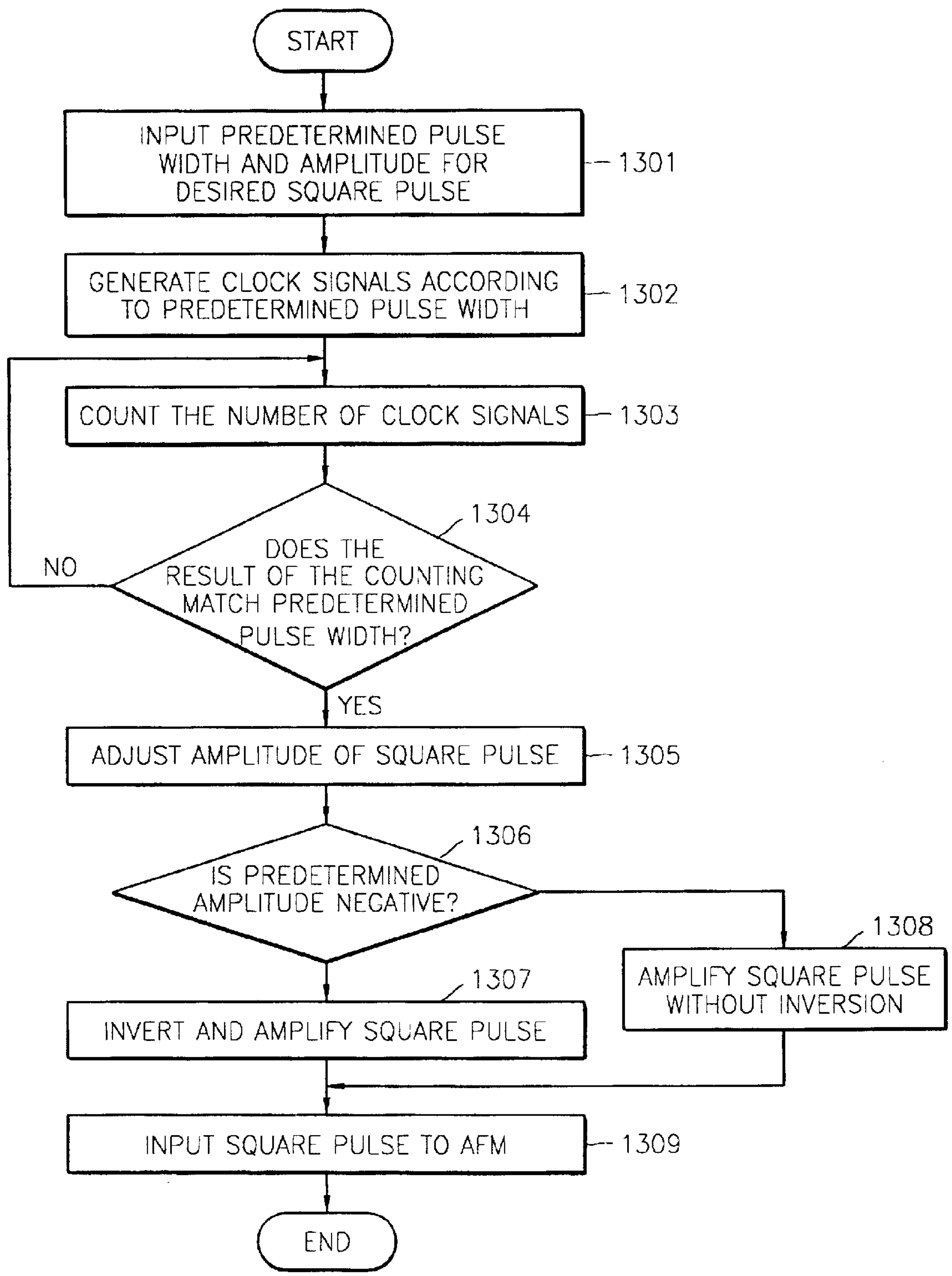
FIG. 13 is a flowchart illustrating a method for providing an input signal to an AFM according to a preferred embodiment of the present invention.

FIG. 13 is a flowchart illustrating a method for generating a square pulse train to be input to an AFM according to a preferred embodiment of the present invention.

A user inputs a predetermined pulse width and amplitude for a desired square pulse via the input unit 200 (Step 1301). In the pulse width adjusting unit 300, the clock generator 303 generates clock signals at a rate according to the predetermined pulse width (Step 1302). As described as an example above, if the predetermined pulse width input by the user is 0.3 μsec, a 10-MHz clock signal is generated according to the time unit of 0.1 μsec.

The counter 302 of the pulse width adjusting unit 300 is triggered by a positive pulse of the square wave and counts the number of clock signals generated by the clock generator 303 (Step 1303). If the result of the counting matches the predetermined pulse width input by the user (Step 1304), the counter 302 generates a termination signal so that the switch portion 301 stops the generation of the positive square pulse and generates a negative square pulse. Only when a lithography enable signal is input, the switch portion 301 outputs a positive pulse of the square wave.

The width-adjusted square pulse is input to and amplified by the amplitude adjusting unit 500 (Step 1305). At this time, it is determined whether the predetermined amplitude input by the user is negative (Step 1306). If the desired output voltage value is negative, the width-adjusted square pulse is inverted and amplified (Step 1308). Otherwise, the width-adjusted square pulse is amplified without inversion (Step 1307).

The amplified square pulse is input to a contact type AFM for a nano-lithography process (Step 1309).

Figure 15:
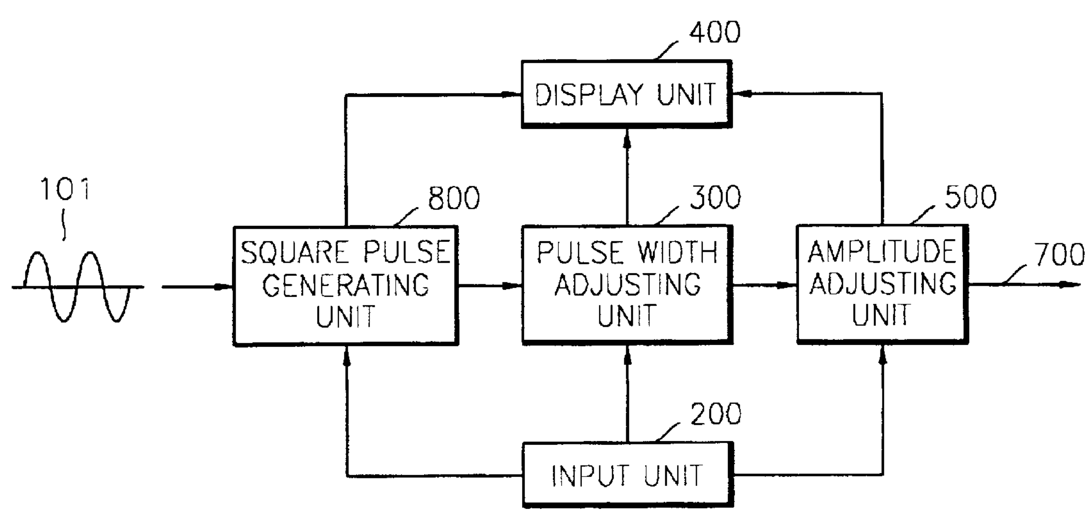
FIG. 15 is a block diagram of an apparatus for providing an input signal to a non-contact type AFM according to the present invention.

To apply the apparatus capable of adjusting the width and amplitude of a square pulse according to the present invention to a non-contact type AFM, an element capable of changing an input sinusoidal wave having a resonant frequency to a square wave. FIG. 15 is a block diagram of an input signal providing apparatus according to the present invention for a non-contact type AFM.

In FIG. 15, the input signal providing apparatus applicable to the non-contact type AFM receives a resonance signal 101. In general, the resonance signal 101 has a frequency of 20–350 kHz and a voltage of 2 Vpp. The resonance signal 101 is input to the non-contact type AFM after being changed to a square pulse train, which has a predetermined phase, width and amplitude that the user wishes to attain, by a square pulse generating unit 800, the pulse width adjusting unit 300, and the amplitude adjusting unit 500. In particular, the square pulse generating unit 800 generates a square pulse having a predetermined phase, which is input by the user via the input unit 200, in synchronization with the resonance signal 101. The pulse width adjusting unit 300 adjusts the width of a positive pulse of the square pulse generated by the square pulse generating unit 800 to a predetermined pulse width, which is input by the user via the input unit 200. The amplitude adjusting unit 500 amplifies the amplitude of the width-adjusted positive pulse of the square pulse output from the pulse width adjusting unit 300 to a predetermined voltage, which is input by the user via the input unit 200.

Information on the square pulse generated through the elements described above is displayed on the display unit 400 to allow the user to confirm the information on the square wave.

Figure 16:
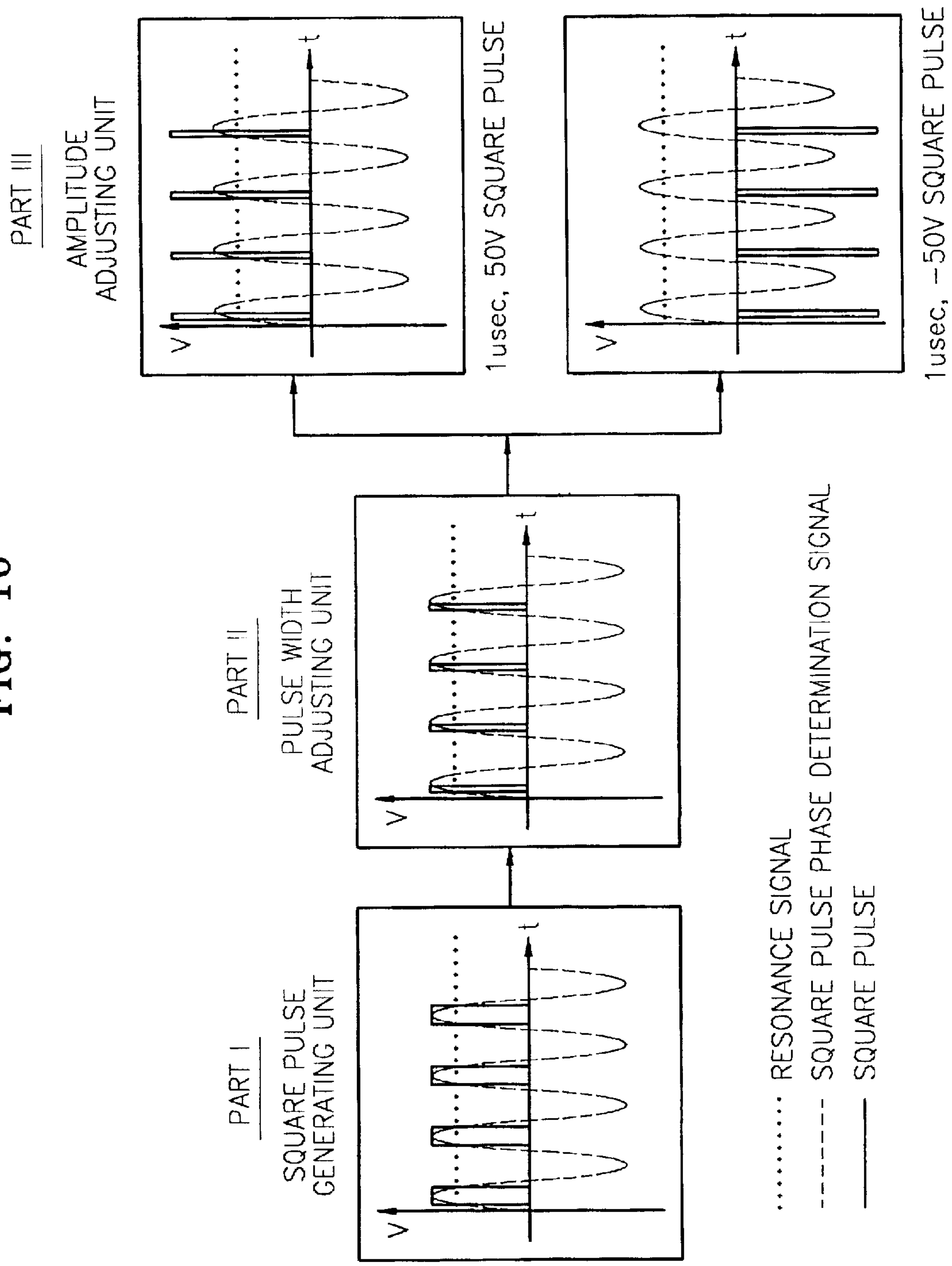
FIG. 16 shows the waveforms generated by each of the elements of FIG. 15.

FIG. 16 shows the waveforms generated by each of the elements of FIG. 15. In FIG. 16, PART I shows a square pulse train generated by the square pulse generating unit 800 in synchronization with the resonance signal 101, PART II shows a square pulse train output from the pulse width adjusting unit 200, and PART III shows a square pulse train from the amplitude adjusting unit 500. The amplitude adjusting portion 500 can amplify the square pulse to a positive or negative voltage.

The constituent elements of the input signal providing apparatus of FIG. 15, except for the square pulse generating unit 800, are the same as those of FIG. 1 for a contact type AFM. Therefore, only the square pulse generating unit 800 will be described here in greater detail.

Figure 17:
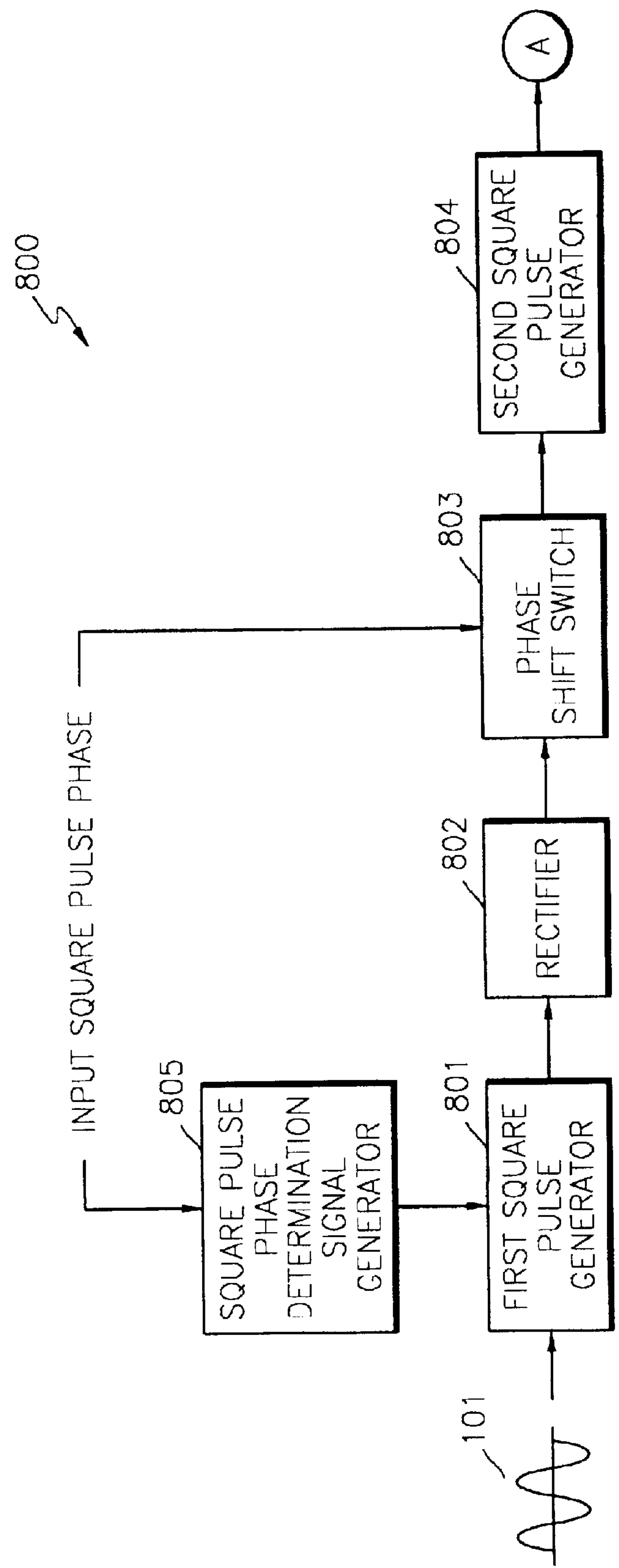
FIG. 17 is a block diagram showing the structure of a square pulse generating unit of FIG. 15.

FIG. 17 is a block diagram showing the structure of the square pulse generating unit 800. Referring to FIG. 17, as a user inputs a desired square pulse trigger point via the input unit 200, the desired square pulse trigger point is input to the square pulse generating unit 800, and a square pulse phase determination signal generator 805 determines whether the desired square pulse trigger point is located in the resonance signal and generates a square pulse phase determination signal. The square pulse phase determination signal is generated as a DC voltage that is equivalent to the voltage of the point of the resonance signal 101 at which a square pulse has occurred.

A first square pulse generator 801 generates a positive pulse of the square pulse at a point of time at which the voltage of the resonance signal 101 rises above the square pulse phase determination signal. A rectifier 802 rectifies the square wave generated by the first square pulse generator 801 to output a square pulse having only either a negative or positive voltage component.

A second square pulse generator 804 changes the square pulse from the rectifier 802 to a digital signal having a high and low level. Preferably, the digital signal has a high voltage of 5V and a low voltage of 0V.

The second square pulse generator 804 includes two separate portions: one for sustaining the phase of the square wave from the rectifier 802 and the other for inverting the phase of the square wave from the rectifier 802. If a user wishes to trigger a square pulse at a point of time at which the voltage of the resonance signal 101 falls below the square pulse phase determination signal, a phase shift switch 803 transmits the square pulse from the rectifier 802 to the phase inverting portion of the second square pulse generator 804. Otherwise, the phase shift switch 803 transmits the square pulse from the rectifier 802 to the phase sustaining portion of the second square pulse generator 804.

Figure 18A:
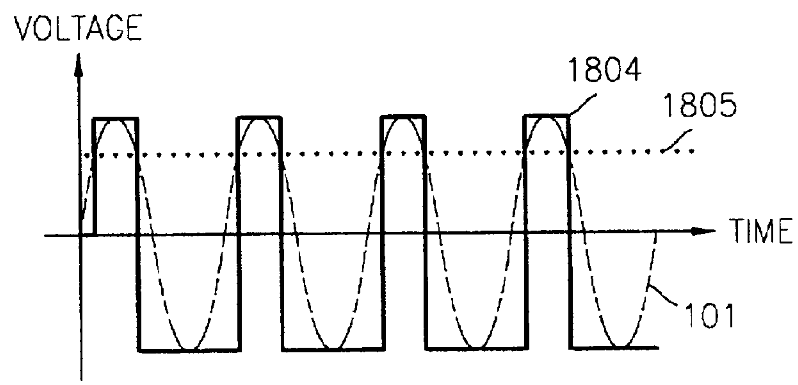
FIGS. 18A through 18C shows the waveforms output from the constituent elements of the square pulse generating unit.
Figure 18B:
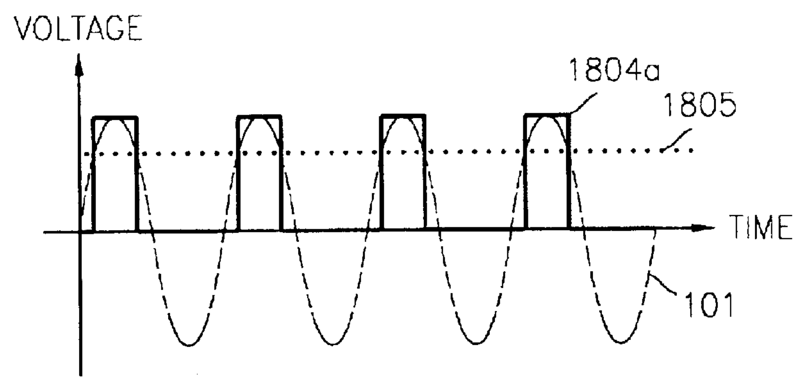
Figure 18C:
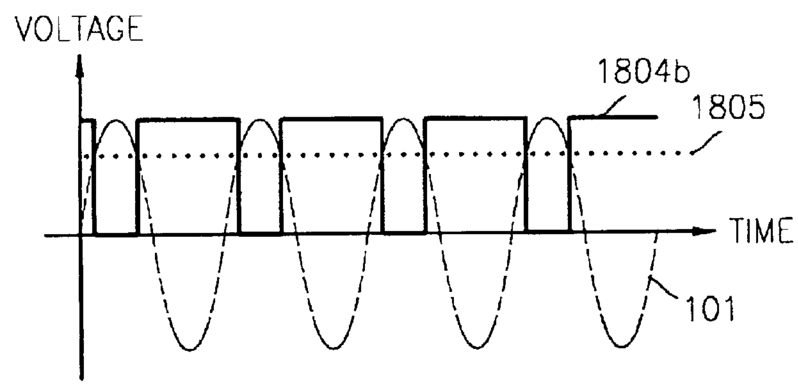
Figure 19:
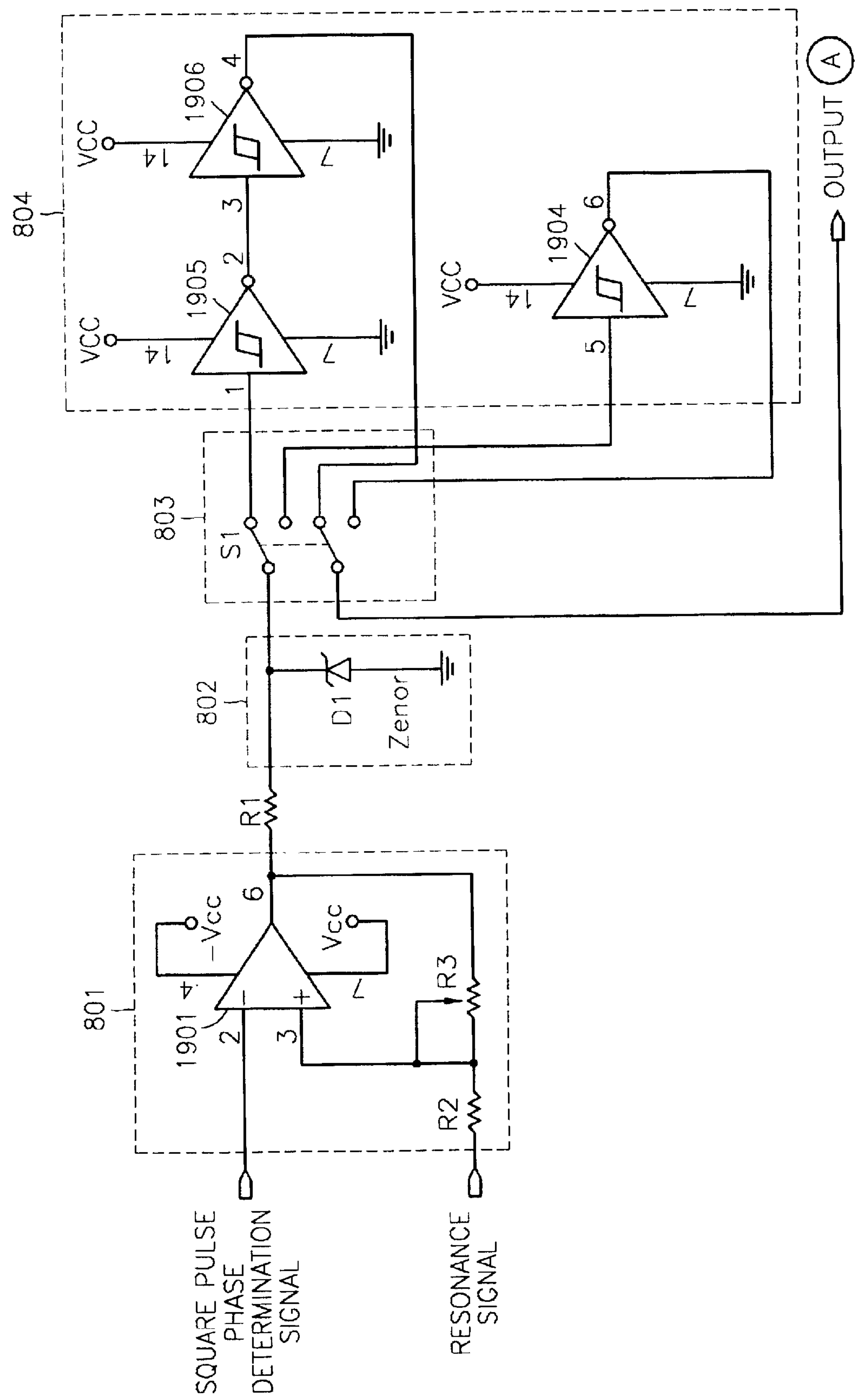
FIG. 19 is a detailed circuit diagram of the square pulse generating unit of FIG. 17.

The structure of the square pulse generating unit 800 will be described in greater detail by means of the following embodiment. FIGS. 18A through 18C shows the waveforms output from the constituent elements of the square pulse generating unit 800. FIG. 19 is a detailed circuit diagram of the square pulse generating unit 800.

In FIG. 19, the first square pulse generator 801 includes one Schmitt trigger 1901. Generally, Schmitt trigger circuits convert a sine wave or triangular wave to a square wave and make a signal robust to ambient noise or noise in the original signal because of hysteresis characteristics.

The upper-threshold voltage and lower-threshold voltage of the Schmitt trigger circuit are calculated by the following formula:

$$V_{UT} = V_{ref}\left(1 + \frac{1}{n}\right) - \frac{V_{-sat}}{n} \quad (3)$$

$$V_{LT} = V_{ref}\left(1 + \frac{1}{n}\right) - \frac{V_{+sat}}{n} \quad (4)$$

$$V_n = V_{UT} - V_{LT} = \frac{(V_{+sat}) - (V_{-sat})}{n} \quad (5)$$

where $V_{UT}$ denotes the upper-threshold voltage, $V_{LT}$ denotes the lower-threshold voltage, $V_H$ denotes the hysteresis voltage, $V_{ref}$ denotes the reference voltage, $n=R_3/R_2$, and $V_{+sat}$ and $V_{-sat}$ denote the high voltage and low voltage, respectively, of a square pulse train generated form the Schmitt trigger. In the present invention, the voltage of the square pulse phase determination signal is used as the reference voltage $V_{ref}$ in the range of $-2.5V<V_{ref}<2.5V$. Also, $1<n<1000$, and $V_+$ The square pulse phase determination signal generated by the square pulse phase determination signal generator 805 (see FIG. 17) as a DC voltage is input to an inverted port of the Schmitt trigger 1901, and the resonance signal 101 is input to a non-inverted port of the Schmitt trigger 1901.

If the resonance signal 101 has a higher voltage level than the square pulse phase determination signal, the Schmitt trigger 1901 outputs $V_{+sat}$. Otherwise, the Schmitt trigger 1901 outputs $V_{-sat}$. The output waveform of the Schmitt trigger 1901 is shown in FIG. 18A. In FIG. 18A, reference numeral 1804 denotes the square pulse train from the Schmitt trigger 1901, reference numeral 1805 denotes the DC voltage of the square pulse phase determination signal generated by the square pulse phase determination signal generator 805, and reference numeral 101 denotes the sinusoidal resonance signal.

The output waveform of the Schmitt trigger 1901 is input to the rectifier 802, which is comprised of a Zenor diode D1, so that the negative voltage component is rectified to 0V. The positive voltage component, rather than the negative voltage component, can be rectified to 0V if the direction of the Zenor diode D1 is inverted.

In the phase shift switch 803, if it is determined that a user wishes to generate a square pulse at a point of time at which the voltage of the resonance signal 101 falls below the square pulse phase determination signal, a switch S1 allows the square pulse from the rectifier 802 to be transmitted to a digital Schmitt trigger 1904 of the second square pulse generator 804. Otherwise, the switch S1 transmits the square pulse from the rectifier 802 to a digital Schmitt trigger 1905 and digital Schmitt trigger 1906.

The digital Schmitt triggers 1904, 1905, and 1906 invert the input signal, each high and low components, and output digital signals. Although the digital Schmitt triggers 1904, 1905, and 1906 are used in the present invention to provide noise robustness, inverters also can be used.

In FIG. 18B, reference numeral 1804*a* denotes a square pulse train passed through the digital Schmitt triggers 1905 and 1906, which has the same waveform as the original through double inversion by the digital Schmitt triggers 1905 and 1906. In FIG. 18C, reference numeral 1804*b* denotes an inverted square pulse train passed through the digital Schmitt trigger 1904. As shown in FIG. 18C, the inverted square pulse 1804*b* occurs during the falling portion of the resonance signal 101.

Figure 20A:
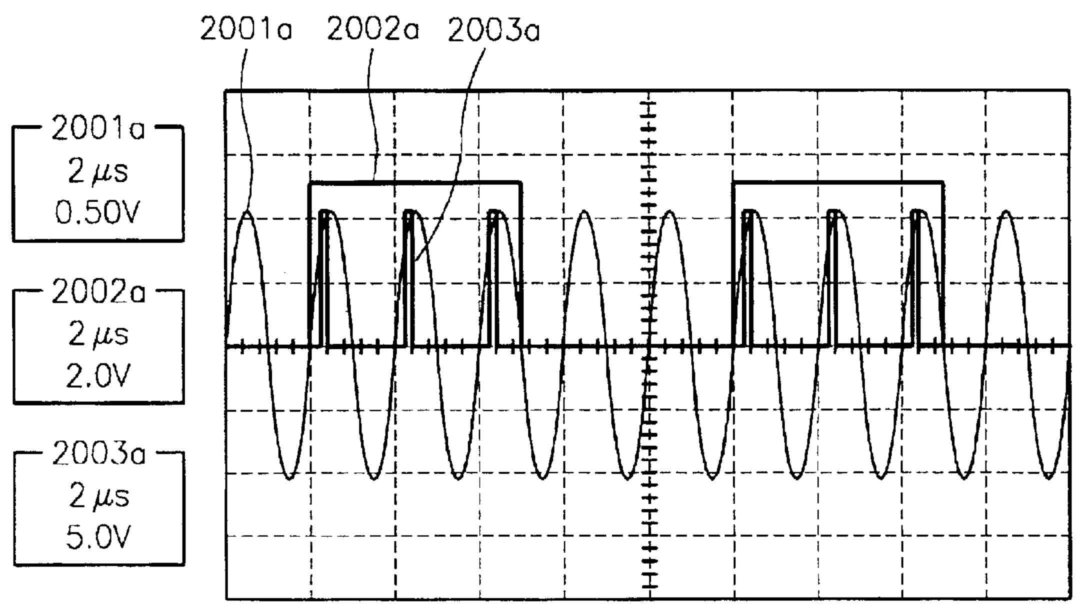
FIGS. 20A, 20B, and 20C show the output waveforms of the square pulse generating unit of FIG. 19 when resonance signals having different frequencies are input.
Figure 20B:
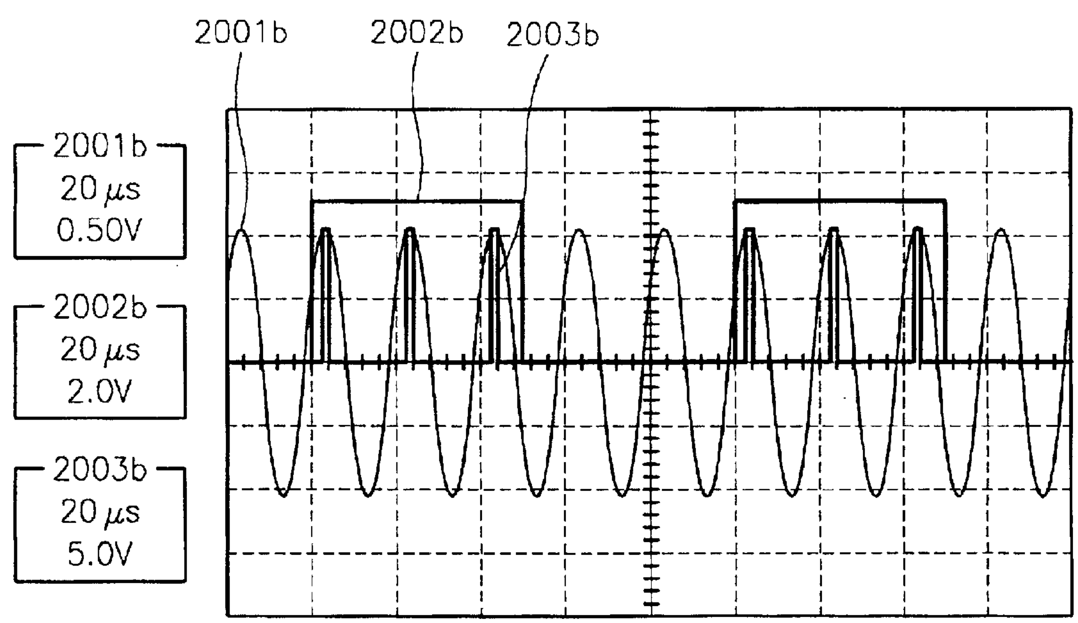
Figure 20C:
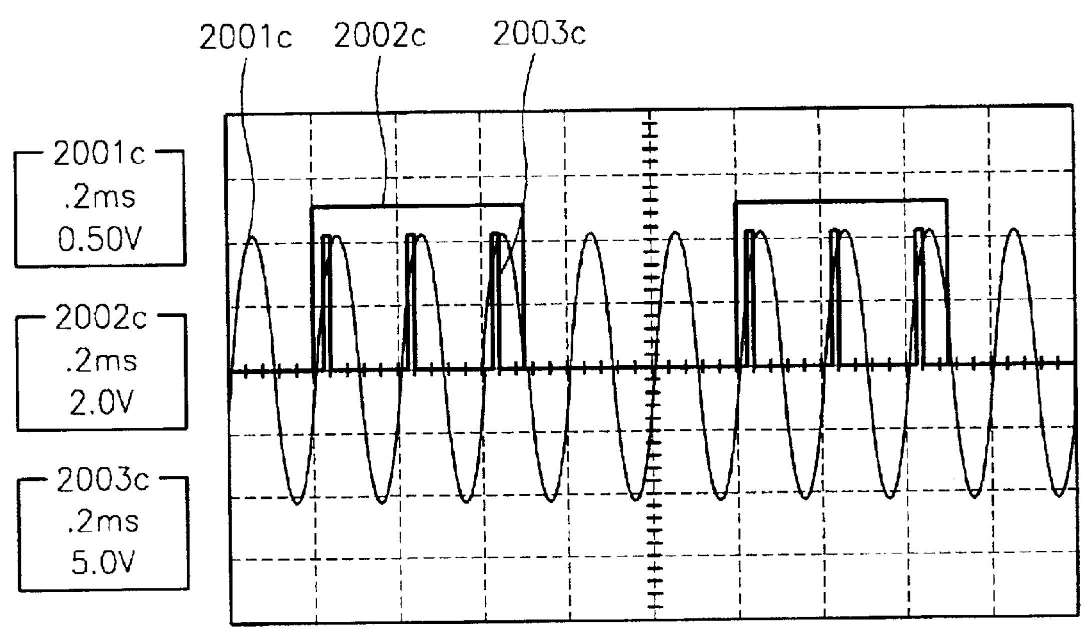

FIGS. 20A, 20B, and 20C show the output waveforms of the square pulse generating unit 800 when resonance signals 2001*a*, 2001*b*, and 2001*c* have a frequency of 500 kHz, 50 kHz, and 5 kHz, respectively. Synchronous square pulses 2003*a*, 2003*b*, and 2003*c* from the square pulse generating unit 800, which are output in synchronization with the resonance signals 2001*a*, 2001*b*, and 2001*c*, respectively, have the same pulse width at 1 μsec. Pulses 2002*a*, 2002*b*, and 2002*c*, which envelope the respective resonance signals 2001*a*, 2001*b*, and 2001*c* and synchronous square pulses 2003*a*, 2003*b*, and 2003*c*, are lithography enable signals. The synchronous square pulses 2003*a*, 2003*b*, and 2003*c* are output while the lithography enable signals are high, to enable a non-contact type AFM to perform a lithography process.

Figure 21:
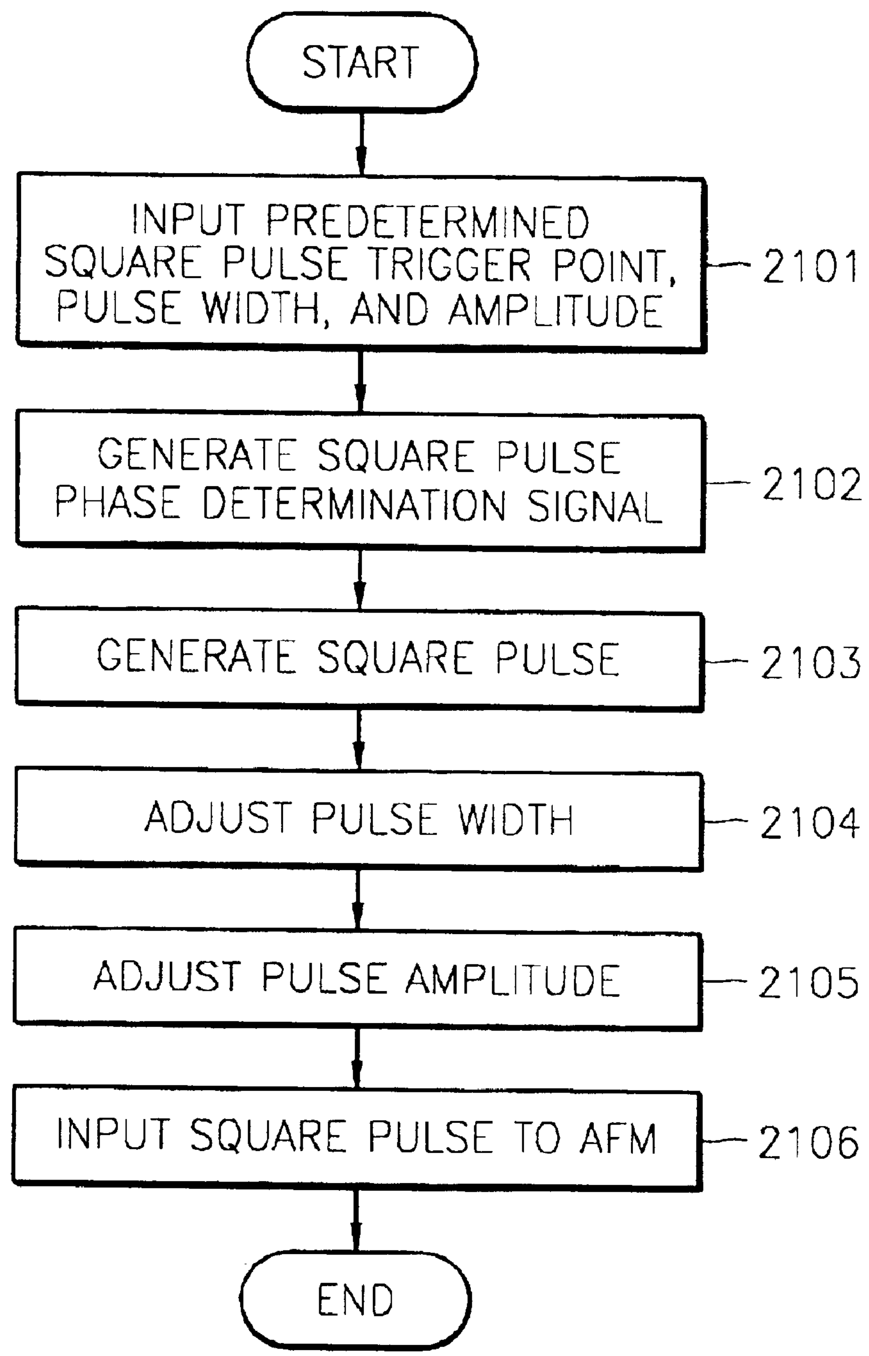
FIG. 21 is a flowchart illustrating a method for providing an input signal to a non-contact type AFM according to the present invention.

FIG. 21 is a flowchart illustrating a method for providing an input signal to a non-contact type AFM using the input signal providing apparatus according to the present invention.

A user inputs a predetermined square pulse trigger point, pulse width, and amplitude via the input unit 200 (Step 2101).

The square pulse phase determination signal generator 805 (see FIG. 17) of the square pulse generating unit 800 determines at which point in the resonance signal the user wishes to trigger a square pulse by using the predetermined square pulse trigger point input by the user, and generates a square pulse phase determination signal having a voltage that is equivalent to the voltage of the point of the resonance signal 101 where the square pulse occurs (Step 2102).

The first square pulse generator 801 generates a positive pulse of a square pulse at a point of time at which the voltage of the resonance signal 101 rises above the square pulse phase determination signal, in synchronization with the resonance signal 101 (Step 2103).

If the user wishes to trigger a square pulse during the falling portion of the resonance signal 101, the square pulse from the first square pulse generator 801 is inverted so that the square pulse is shifted to the falling portion of the resonance signal 101. After the generation of the square pulse, the square pulse train passes through a digital Schmitt trigger or inverter to output a digital signal from which noise has been removed.

After Step 2103, the pulse width and amplitude of the square pulse are adjusted according to the predetermined pulse width and amplitude input by the user (Steps 2104 and 2106). Steps 2104 and 2106 are the same as described with reference to FIG. 13.

The present invention may be embodied as a computer readable medium having a computer readable program code unit embodied therein for providing an input signal to an AFM. The computer readable medium includes any types of storage media readable by a computer system. Examples of the computer readable medium include magnetic storage media (e.g., ROMs, RAMs, floppy discs, etc.), optically readable media (e.g., CD-ROMs, DVDs, etc.), and carrier waves (e.g., transmissions over the Internet). The computer readable medium may store therein a computer readable program code which can be transmitted to and operated in multiple computer systems connected by a network.

As described above, an apparatus and method for providing an input signal to an AFM according to the present invention can provide a square pulse having a desired pulse width and amplitude to the AFM. For a non-contact type AFM, a square pulse can be generated at a desired point of time in synchronization with an input resonance signal so that a more precise nano-sized pattern can be formed with improved reliability, compared to when using conventional techniques.

What is claimed is:

1. An apparatus for providing an input signal to a non-contact type atomic force microscope (AFM) for use in nano-lithography with a resonance signal of the AFM, the apparatus comprising:

an input unit via which a user inputs parameters which determine the waveform of a desired square pulse train;

a square pulse generating unit which generates a square pulse of the square pulse train having a predetermined phase in synchronization with the resonance signal, and a pulse width adjusting unit which adjusts the width of a positive pulse of the square pulse train to a predetermined pulse width.

2. The apparatus of claim 1, further comprising an amplitude adjusting unit which amplifies the amplitude of the positive pulse of the square pulse to a train to a predetermined voltage.

3. The apparatus of claim 1, further comprising a display unit which allows a user to confirm the waveform of the desired square pulse train.

4. The apparatus of claim 1, wherein the square pulse generating unit comprises:

a square pulse phase determination signal generator which generates a square pulse phase determination signal as a predetermined DC voltage according to a desired square pulse trigger point; and a first square pulse generator which generates a positive pulse of the square pulse train at a point of time at which the voltage of the resonance signal rises above the square pulse phase determination signal.

5. The apparatus of claim 4, wherein the square pulse generating unit further comprises a square pulse phase shifter which shifts the positive pulse output from the first square pulse generator to a point of time at which the voltage of the resonance signal falls below the square pulse phase determination signal.

6. The apparatus of claim 4, wherein the first square pulse generator comprises a Schmitt trigger having an inverted port for receiving the square pulse phase determination signal and an non-inverted port for receiving the resonance signal.

7. The apparatus of claim 1, wherein the pulse width adjusting unit comprises:

a clock generator which generates clock signals at a different rate depending on the predetermined pulse width;

a counter which counts the number of clock signals upon generation of the positive pulse of the square pulse train during the predetermined pulse width and outputs a termination signal; and a switch portion which sustains the positive pulse of the square pulse train until the termination signal is generated by the counter.

8. The apparatus of claim 2, wherein the amplitude adjusting unit amplifies the square pulse from the pulse width adjusting unit, directly or after inversion, to the predetermined voltage.

9. A method for providing an input signal having a desired pulse width and amplitude to a non-contact type atomic force microscope (AFM) for use in nano-lithography with a resonance signal of the AFM, the method comprising:

inputting parameters from a user which determine the waveform of a desired square pulse train;

generating a square pulse of the square pulse train having a predetermined phase in synchronization with the resonance signal; and adjusting the width of a positive pulse of the square pulse train to a predetermined pulse width.

10. The method of claim 9, further comprising adjusting the amplitude of the positive pulse of the square pulse train to a predetermined amplitude.

11. The method of claim 9, wherein generating the square pulse having the predetermined phase comprises:

generating a square pulse phase determination signal as a predetermined DC voltage according to a desired square pulse trigger point; and generating a positive pulse of the square pulse train at a point of time at which the voltage of the resonance signal rises above the square pulse phase determination signal.

12. The method of claim 10, wherein when a user desires to trigger a square pulse at a point of time at which the voltage of the resonance signal falls below the square pulse determination signal, generating the square pulse having the predetermined phase comprises shifting a square pulse trigger point where the positive pulse has been triggered, through inversion.

13. The method of claim 9, wherein adjusting the width of the positive pulse of the square pulse train comprises:

generating clock signals at a different rate depending on the predetermined pulse width;

determining whether a lithography enable signal is input;

if the lithography enable signal has been input, generating the square pulse while counting the number of clock signals until the result of the counting equals a predetermined number, such that the positive pulse is sustained during the predetermined pulse width.

14. A computer readable medium having embodied thereon a computer program for providing an input signal having a desired pulse width and amplitude to a non-contact type atomic force microscope (AFM) for use in a nano-lithography with a resonance signal, wherein providing the input signal to the non-contact type AFM comprises:

inputting parameters from a user which determine the waveform of a desired square pulse train;

generating a square pulse of the square pulse train having a predetermined phase in synchronization with the resonance signal; and adjusting the width of a positive pulse of a square pulse train to a predetermined pulse width.

15. A method for providing an input signal having a desired pulse width and amplitude to a non-contact type atomic force microscope (AFM) for use in nano-lithography with a resonance signal, the method comprising:

inputting parameters from a user which determine the waveform of a desired square pulse train;

generating a square pulse of the square pulse train having predetermined phase in synchronization with the resonance signal; and adjusting the width of a positive pulse of the square pulse train to a predetermined pulse width determined by the input parameters.

16. A computer readable medium having embodied thereon a computer program for providing an input signal having a desired pulse width and amplitude to an non-contact type atomic force microscope (AFM) for use in a nano-lithography with a resonance signal, wherein providing the input signal to the non-contact type AFM comprises:

inputting parameters from a user which determine the waveform of a desired square pulse train;

generating a square pulse of the square pulse train having a predetermined phase in synchronization with the resonance signal; and adjusting the width of a positive pulse of the square pulse train to a predetermined pulse width by the input parameters.

* * * * *